(12) United States Patent
Gauthier

(10) Patent No.: US 8,526,539 B2
(45) Date of Patent: Sep. 3, 2013

(54) COMPUTATIONAL GENERATION OF NARROW-BANDWIDTH DIGITAL SIGNALS

(75) Inventor: Laurent Gauthier, Toulouse (FR)

(73) Assignee: Freescale Semiconductor, Inc., Austin, TX (US)

( * ) Notice: Subject to any disclaimer, the term of this patent is extended or adjusted under 35 U.S.C. 154(b) by 83 days.

(21) Appl. No.: 13/060,170

(22) PCT Filed: Aug. 26, 2008

(86) PCT No.: PCT/IB2008/054481
§ 371 (c)(1), (2), (4) Date: Feb. 22, 2011

(87) PCT Pub. No.: WO2010/023509
PCT Pub. Date: Mar. 4, 2010

(65) Prior Publication Data
US 2011/0150141 A1    Jun. 23, 2011

(51) Int. Cl.
*H03C 3/00* (2006.01)
(52) U.S. Cl.
USPC ............ 375/303; 327/108; 327/170; 341/143
(58) Field of Classification Search
None
See application file for complete search history.

(56) References Cited

U.S. PATENT DOCUMENTS

| | | | |
|---|---|---|---|
| 3,983,493 A | 9/1976 | Gladstone | |
| 6,438,176 B1 | 8/2002 | Haran et al. | |
| 6,452,428 B1 * | 9/2002 | Mooney et al. | 327/108 |
| 6,873,218 B2 | 3/2005 | Khlat | |
| 2005/0127967 A1 | 6/2005 | Allen | |
| 2006/0267651 A1 * | 11/2006 | Hargan | 327/170 |
| 2008/0018509 A1 * | 1/2008 | Colmer | 341/143 |
| 2008/0157843 A1 | 7/2008 | Young | |
| 2009/0021408 A1 * | 1/2009 | Lee et al. | 341/143 |

OTHER PUBLICATIONS

International Search Report and Written Opinion correlating to PCT/IB2008/054481 dated Oct. 21, 2009.

* cited by examiner

Primary Examiner — Adolf Dsouza

(57) ABSTRACT

A signal shaper generates an output signal representing a binary sequence, the output signal being the time-dependence of a signal value F. The signal shaper is input a first signal value $F_0$ and a different second signal value $F_1$, and receives a sequence of data bits. If the state of a first data bit and the state of a second data bit differ, the signal shaper controls the signal value F to change monotonically from the first signal value $F_0$ or the second signal value $F_1$ at a first point in time via one or more intermediate values at intermediate points in time to the second signal value $F_1$ or the first signal value $F_0$ at a later second point in time. On the time interval from the first point in time to the second point in time, the output signal may be a monotonic step function.

20 Claims, 6 Drawing Sheets

| STEP | COMPUTE | FREQUENCY F | | RATIO F/$F_{ref}$ |
|---|---|---|---|---|
| -1 | 0 | $F_0$ | 434.0000 MHz | 16.69230 |
| 0 | 1/256 | $F_0$ + dF/256 | 434.0004 MHz | 16.69246 |
| 1 | 1/128 | $F_0$ + dF/128 | 434.0008 MHz | 16.69261 |
| 2 | 1/64 | $F_0$ + dF/64 | 434.0016 MHz | 16.69236 |
| 3 | 1/32 | $F_0$ + dF/32 | 434.0031 MHz | ... |
| 4 | 1/16 | $F_0$ + dF/16 | 434.0062 MHz | ... |
| 5 | 1/8 | $F_0$ + dF/8 | 434.0125 MHz | ... |
| 6 | 1/4 | $F_0$ + dF/4 | 434.0250 MHz | ... |
| 7 | 1/2 | $F_0$ + dF/2 | 434.0500 MHz | 16.69423 |
| 8 | 1 - 1/4 | $F_1$ + dF/4 | 434.0750 MHz | ... |
| 9 | 1 - 1/8 | $F_1$ + dF/8 | 434.0875 MHz | ... |
| 10 | 1 - 1/16 | $F_1$ + dF/16 | 434.0937 MHz | ... |
| 11 | 1 - 1/32 | $F_1$ + dF/32 | 434.0969 MHz | ... |
| 12 | 1 - 1/64 | $F_1$ + dF/64 | 434.0984 MHz | ... |
| 13 | 1 - 1/128 | $F_1$ + dF/128 | 434.0992 MHz | ... |
| 14 | 1 - 1/256 | $F_1$ + dF/256 | 434.0996 MHz | 16.69614 |
| 15 | 1 | $F_1$ | 434.1000 MHz | 16.69615 |

COMPUTATIONAL GENERATION OF NARROW-BANDWIDTH DIGITAL SIGNALS

FIELD OF THE INVENTION

This invention relates to a signal shaper for generating an output signal representing a binary sequence, the output signal being the time-dependence of a signal value F.

The invention also relates to a communication system.

The invention further relates to method of generating an output signal representing a binary sequence, and to an information carrier carrying code portions for executing steps of the method.

BACKGROUND OF THE INVENTION

Conversion of binary data into a continuous physical signal finds application in virtually any domain of digital information processing technology.

Schematically represented in Part A of FIG. 1 is an example of a sequence of data bits 12. The sequence 12 comprises a total of seven data bits, each of which may assume either a logical "zero" ("0") state or a logical "one" ("1") state. A first bit 11 and a subsequent second bit 13 in the exemplary sequence 12 are in the states "0" and "1", respectively. In the example shown, the seven data bits of the sequence define the sequence "0 1 0 1 1 0 0". In practice, a sequence of data bits may comprise millions or billions of data bits. The sequence of data bits 12 may be communicated from one device to another device by transmitting it in the form of a binary signal 14 (Part B of the figure). The binary signal 14 is the time-dependence of a physical quantity, typically a frequency or amplitude of an electrical voltage or current, or of an electromagnetic field at a given spatial position. The signal value, defined as the instantaneous value of the physical quantity, varies in time t in accordance with the sequence of data bits 12. In a Frequency Shift Keying (FSK) system, the signal value is typically the oscillation frequency of a voltage or current, to be transmitted via transmission lines or to be fed to an antenna. Each data bit in the sequence 12 is allocated a time slot of length T during which the signal value assumes either a first signal value $F_0$ or second signal value $F_1$, depending on whether the respective data bit is the "one" or "zero" state. The inverse of the length T is the bit rate, that is, the number of data bits transmitted per time. It is noted that the signal 14 thus defined varies abruptly whenever a data bit and the subsequent data bit (e.g. bit 11 and bit 13) differ. As is well known, an abrupt change in value of a function corresponds to a wide Fourier spectrum of that function. Thus, for applications in which a narrow bandwidth of the binary signal is desired, the binary data is encoded in the form of a signal 16 varying more gently, as is illustrated in Part C of the Figure. In the domain of FSK systems, the desire of reducing the bandwidth of the transmitted signal has led to the development of Gaussian Frequency Shift Keying (GFSK). According to this method, a wideband signal such as the binary signal 14 is passed through a Gaussian filter in order to generate a signal (in the example, the signal 16) having a reduced bandwidth. The signal having the reduced bandwidth is essentially the convolution of the wideband signal 14 and a Gauss function. The Gaussian filter may be an analog filter, or it may be implemented digitally, involving either a sampling of the wideband input signal 14 or direct generation from the sequence of data bits 12.

FIG. 2 schematically shows a signal shaper 10. The signal shaper 10 has an input port for receiving a sequence of data bits 12 and an output port for delivering a signal 16 in which the sequence of data bits 12 is encoded. The signal 16 is a physical quantity that varies in time as prescribed by the sequence of data bits 12. In the case where the data bits of the sequence 12 are fed successively to the signal shaper, i.e. in the form of a bit stream having a bit rate, the bit rate of the emitted signal 16 may be equal to or greater than the rate of the received bit stream. A signal shaper of this type finds application in a vast variety of digital signal processing devices. The signal shaper 10 may, for example, be part of an FSK system, in particular for applications in which a narrow bandwidth of the emitted signal is required, e.g. in telecommunications. The signal shaper 10 may in particular be employed in automotive applications, such as tire pressure monitoring systems (TPMS) or remote keyless entry (RKE) systems.

Shown in FIG. 3 is an example of an embodiment of a signal shaper 10 according to the prior art, for use within a frequency shift keying system. The signal shaper 10 comprises a Gaussian filter 24 for receiving a time-dependent binary voltage 20 representing binary data, and an analog phase-locked loop (PLL) 26. The PLL 26 comprises, as a core element, a voltage-controlled oscillator (VCO) 28 generating a frequency F in the radio-frequency range (i.e. a few Hertz up to many Gigahertz). The output signal 16 of the VCO, that is, a voltage oscillating at the frequency F, is coupled via a frequency divider 30 to a phase comparator 32 controlling an input voltage of the VCO 28, so as to provide a negative feedback signal to the VCO 28, thereby stabilizing the oscillation frequency F of the VCO. The phase comparator 32 receives as input a fixed reference frequency $F_{ref}$. The reference frequency $F_{ref}$ being lower than the generated frequency F, it serves to set a reference phase to which the phase of the VCO is continually adapted. Coupled between the phase comparator 18 and the summator 36 is a low-pass filter 34 (loop filter) for stabilizing the loop. Further coupled between the loop filter 34 and the VCO 28 is a summator 36 for adding to the control voltage output by the loop filter 34 an external voltage 22. The frequency F generated by the PLL 26 can thus be modulated externally (that is, from outside the loop) by varying the external control voltage 22. The external voltage 22 is the output generated by the Gaussian filter 24, i.e. a binary signal having a reduced band-width. Thus the frequency F output by the VCO 28 is modulated with the variation of the external voltage 22, which in turn represents the data encoded in the binary signal 20.

The approach described above with reference to FIG. 3 is analog in the sense that the output frequency of the PLL 26 is modulated by a continuous analog signal, namely the voltage 22 received from the Gaussian filter 24. This approach has been realized for years, but is not necessarily suitable for integrated solutions as the gain of the VCO 28 is usually not well controlled.

SUMMARY OF THE INVENTION

The present invention provides a signal shaper, a communication system, a method, and an information carrier as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

FIG. 7 illustrates, in an exemplary manner, computational steps for generating the signal represented in FIG. 6.

Figure 1:
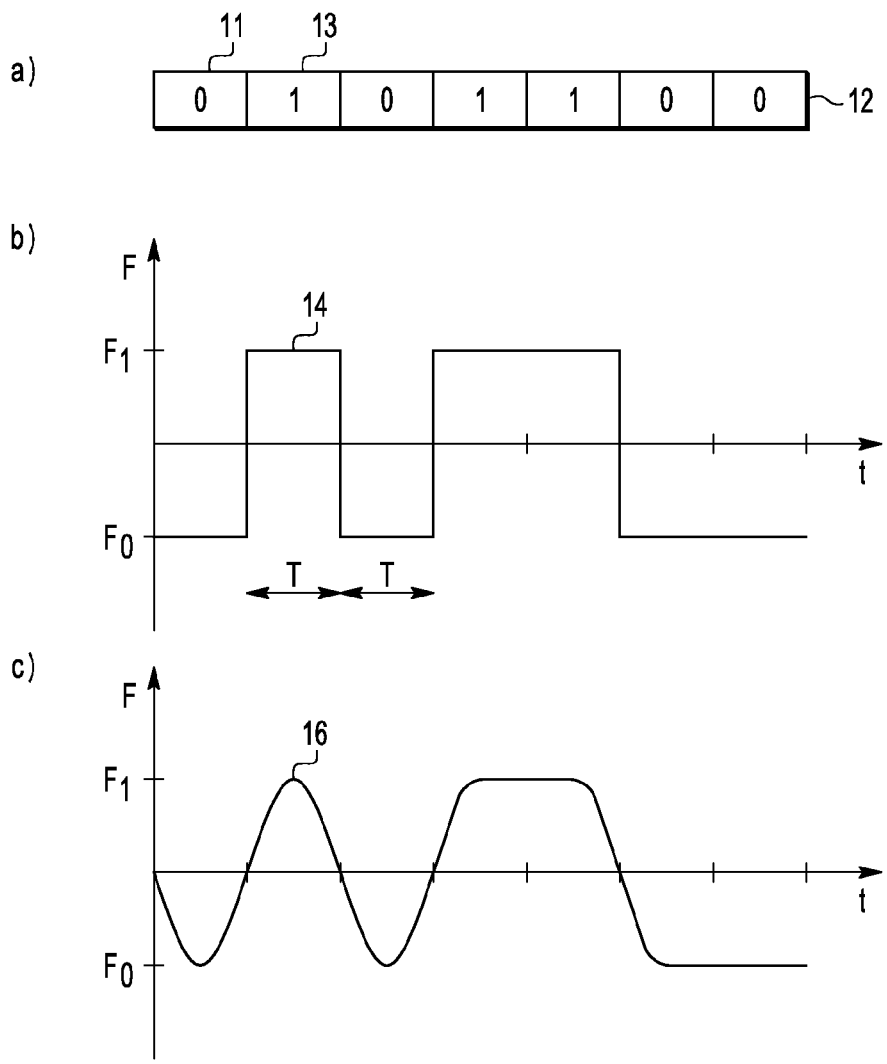
FIG. 1 schematically illustrates an example of a sequence of data bits, a corresponding binary signal, and a corresponding signal having a reduced bandwidth.
Figure 2:
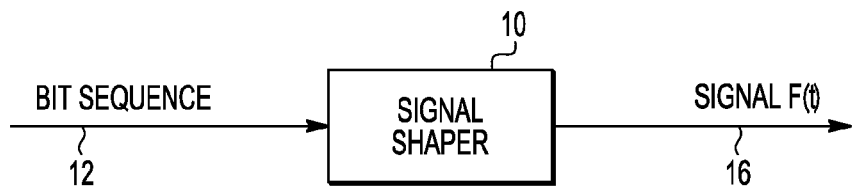
FIG. 2 schematically illustrates a generic signal shaper.

Further details, aspects and embodiments of the invention will be described, by way of example only, with reference to the drawings. Elements in the figures are illustrated for simplicity and clarity and have not necessarily been drawn to scale. Identical, similar or analogous components appearing in different figures are labeled using the same reference numerals and are not necessarily described more than once.

DETAILED DESCRIPTION OF THE PREFERRED EMBODIMENTS

Figure 3:
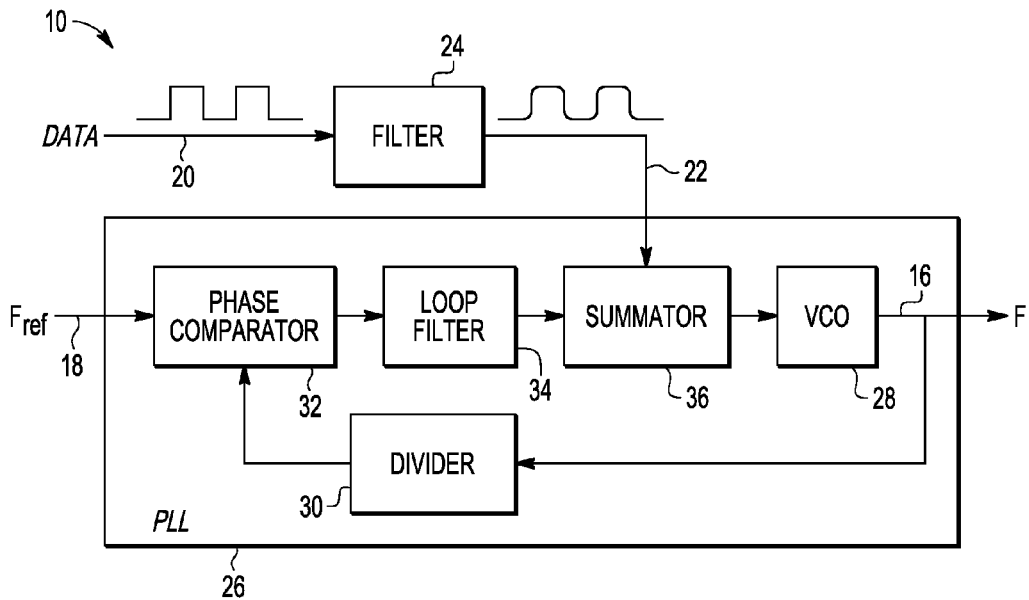
FIG. 3 schematically shows an example of an embodiment of a prior art signal shaper.
Figure 4:
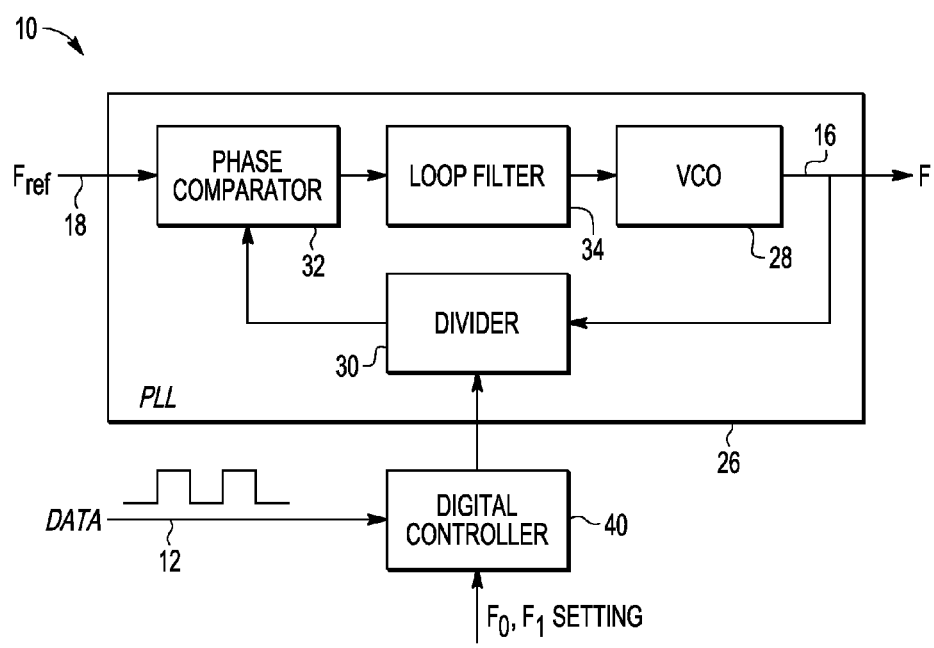
FIG. 4 schematically shows an example of an embodiment of a signal shaper according to the invention.

FIGS. 4 to 7 illustrate, in an exemplary manner, a digital solution. Shown in FIG. 4 is a signal shaper 10 for generating an output signal 16 representing a binary sequence, the output signal 16 being the time-dependence of a signal value F. The signal shaper 10 may, for example, be part of a communication system, in particular a wireless communication system or a frequency-shift keying system. The signal shaper 10 receives a first signal value $F_0$ and a different second signal value $F_1$. The signal shaper 10 may be capable of memorizing the first signal value $F_0$ and the second value $F_1$; in this case, the values $F_0$ and $F_1$ may be read from memory in order to generate the output signal 16. The signal shaper 10 receives a sequence of data bits 12, each data bit having a state which is either "zero" or "one", the sequence containing at least a first data bit 11 and a subsequent second data bit 13, as shown above in an exemplary manner in FIG. 1. The signal shaper 10 determines the state of the first data bit 11 and the state of the second data bit 13. If it has determined that the state of the first data bit 11 and the state of the second data bit 13 are "zero" and "one", respectively, it controls the signal value F to change monotonically from the first signal value $F_0$ at a first point in time 2 via one or more intermediate values at intermediate points in time 4 to a the second signal value $F_1$ at a later second point in time 6, as illustrated in an exemplary manner in FIG. 6. Similarly, if the signal shaper 10 had determined that the state of the first data bit 11 and the state of the second data bit 13 are "one" and "zero", respectively, it would control the signal value F to change monotonically from the second signal value $F_1$ at the first point in time 2 via one or more intermediate values at intermediate points in time 4 to the first signal value $F_0$ at the second point in time 6. In the example shown, the signal value is the oscillation frequency delivered by a phase-locked loop 26 similar to the PLL described above with reference to FIG. 3, with the distinction that in the present example the frequency ratio of the divider 30 can be set digitally. The signal shaper 10 comprises a controller 40 for controlling the signal value F, i.e. the oscillation frequency delivered by the phase-locked loop 26, as a function of the received sequence of data bits 12. The controller 40 may, for example, comprise a microcontroller having a processor and a memory, the memory carrying instructions which are executable by the processor.

Figure 5:
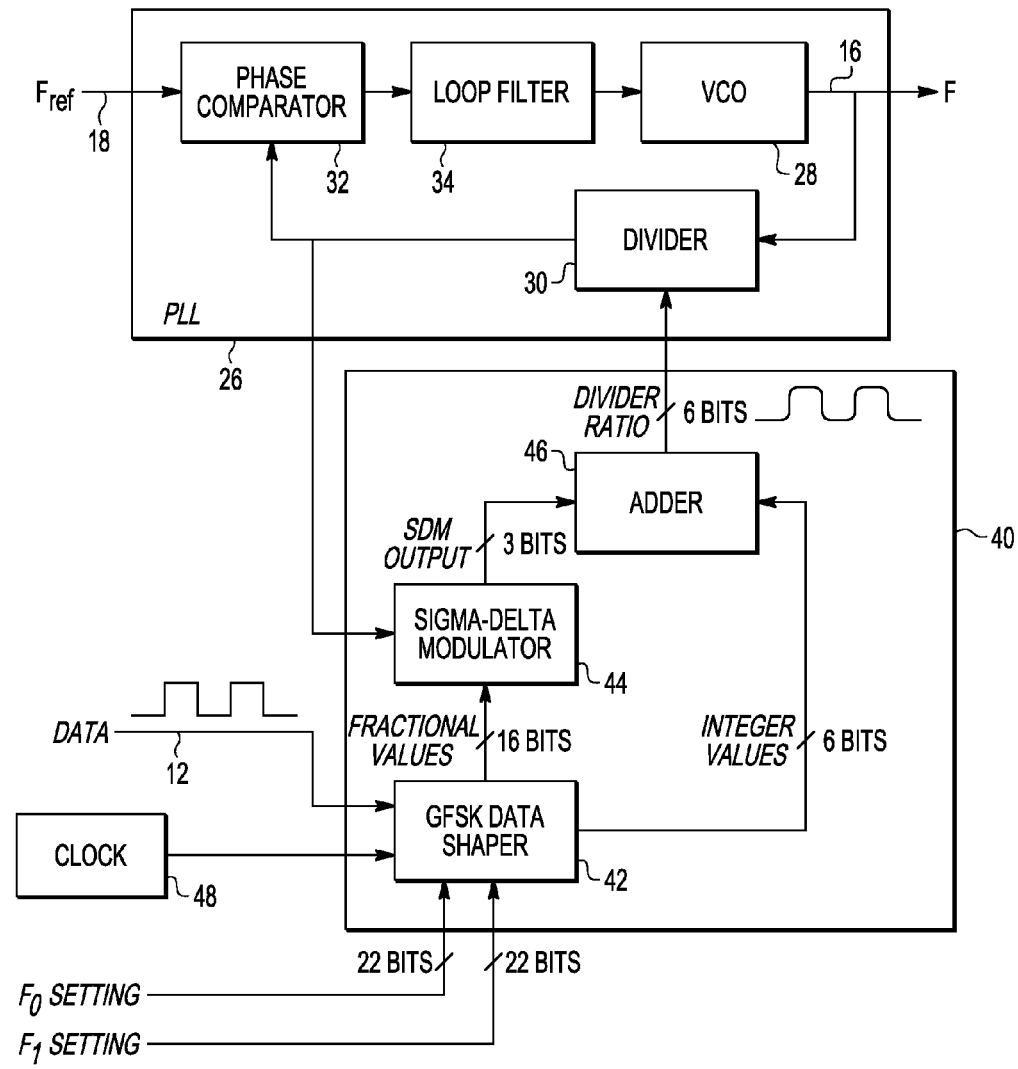
FIG. 5 schematically illustrates a particular example of a signal shaper as shown in FIG. 4.

Referring now more particularly to FIG. 5, there is shown in greater detail an example of an embodiment of a signal shaper 10 of the type represented in FIG. 4. The phase-locked loop 26 comprises a frequency divider 30 having a frequency ratio, the frequency ratio determining the oscillation frequency delivered by the phase-locked loop 26. The controller 40 controls the frequency ratio. More specifically, the controller 40 generates a frequency ratio signal indicating an integer number (for example, in the form of 6 bits) to the frequency divider 30, the integer number defining the frequency ratio. The controller 40 varies the frequency ratio signal at a rate at least 50 times greater than the inverse of the time gap 8 between the first point in time 2 and the second point in time 6. To this end, the controller 40 comprises a sigma-delta modulator 44 for generating the frequency ratio signal. Thus a non-integer (i.e. fractional) ratio between the output frequency F and the reference frequency $F_{ref}$ can be obtained, the fractional ratio being given by a time-averaged succession of integer numbers generated by the controller 40. In an exemplary embodiment, the output frequency of the sigma-delta modulator 44 is about 13 megahertz while the data rate of the output signal 16 is less than 50 kilobits per second. The controller 40 comprises as a core element a data shaper 42 for receiving and analyzing the sequence of data bits 12. The data shaper 42 determines the required frequency ratio between the output frequency F and the reference frequency $F_{ref}$ so as to modulate the output frequency F in accordance with the sequence of data bits 12. At any point in time, the data shaper 42 outputs an integer value (for example, in the form of 6 bits) and a fractional value (for example, in the form of 16 bits) the sum of which is the required frequency ratio. The integer value is fed to an adder 46, whereas the fractional value is fed to the sigma-delta modulator 44. The sigma-delta modulator 44 outputs the fractional value in the form of a fast succession of integer values (for example, in the form of 3 bits), which when averaged over a suitable time interval, corresponds to the fractional value. The integer values output by the sigma-delta modulator 44 are fed to the adder 44. The adder 44 adds the integer values received from the data shaper 42 and the integer values received from the sigma-delta modulator 44 and transmits the resulting integer sum, which rapidly varies in time, to the frequency divider 30 which consequently adapts the frequency ratio, thereby modifying the frequency F output by the VCO 28. The signal shaper 10 further comprises a clock 48 for determining the intermediate points in time and the second point in time 6 relative to the first point in time 2. By changing the clock period, it is possible to change the rate at which the signal value (here, the frequency F) changes from $F_0$ and $F_1$, and from $F_1$ to $F_0$, respectively. It is further noted that the signal shaper 10 may be an integrated circuit.

Figure 6:
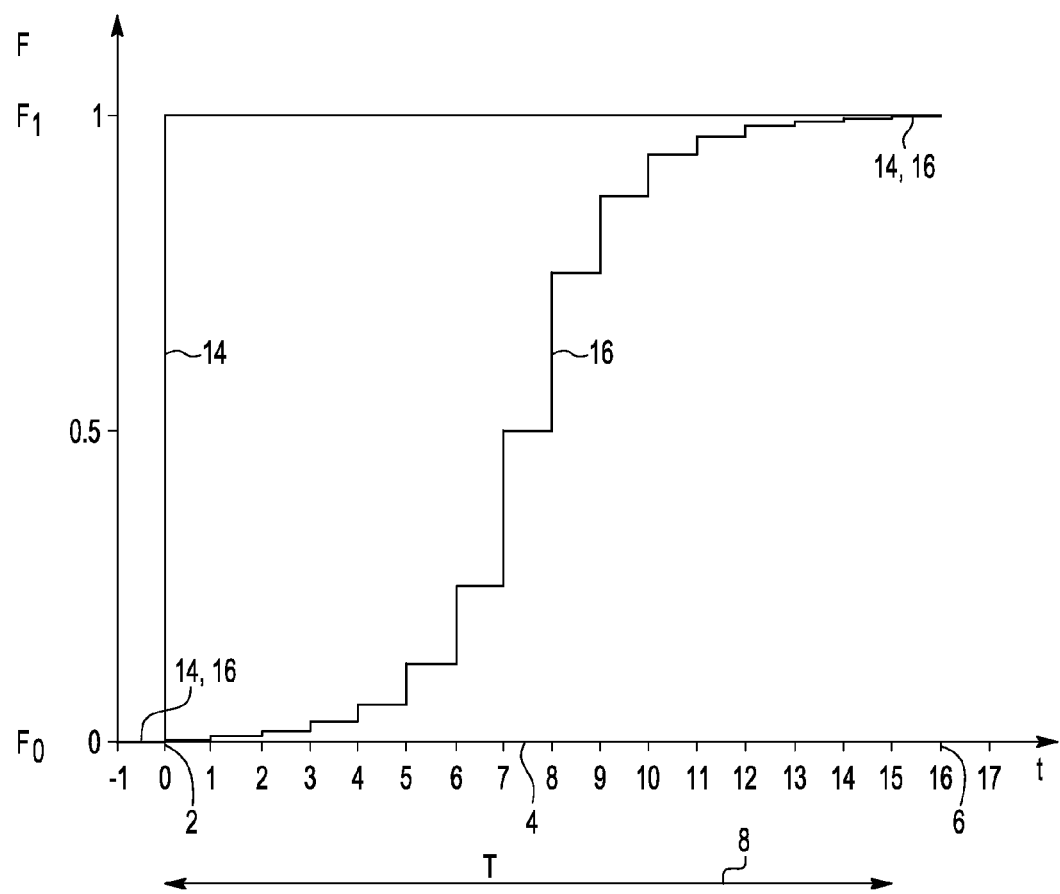
FIG. 6 schematically illustrates an example of a signal delivered by a signal shaper according to the invention.

Referring now more specifically to FIG. 6, there is illustrated in an exemplary manner the output signal 16 generated by the signal shaper 10 discussed above with reference to FIGS. 4 and 5, for a time period not much longer than required for representing a single data bit. On the time interval from the first point in time 2 to the second point in time 6, the output signal 16 is a monotonic step function. The intermediate points in time comprise 2N+1 equidistant points in time at which the signal value assumes the following values:

$F_0 + \Delta F/2^{k+1}$ where k=0, ..., N; and $F_1 - \Delta F/2^{k+1}$ where k=1, ..., N;

N being an integer number equal to or greater than zero, and $\Delta F$ being the difference $F_1 - F_0$. Note that the running index k does not reflect the chronological order of the intermediate points in time. In the example shown, N=7. Gaussian filtering may thus be approximated by building the output signal using basic digital operations. An analogous formula is used to make the signal value F decrease from $F_1$ to $F_0$ when a change from a "one" bit to a zero "bit" is detected in the sequence of data bits 12. As compared to a binary signal 14 representing the same sequence of data bits 12, the output signal 12 has a significantly reduced bandwidth. Indeed the output signal 16 as defined by the present formula is very similar to a signal generated by Gaussian filtering. It is pointed out that the shape of the output signal 16 is not directly linked to a data rate at which the data bits of the input sequence 12 are received, as the time step for the various samples of the output signal 16 is defined using a register. Thus the shape time can be programmed. This provides flexibility that cannot be obtained if the shape is directly defined by a data rate. In particular, a filter cut-off frequency for the output data and the data rate can be defined separately. However, according to a specific embodiment, the signal shaper 10 may be capable of receiving the sequence of data bits 12 in the form of a bit stream and of recognizing a bit rate of the bit stream; the first point in time 2 and the second point in time 6 may then be separated by a time gap (T) 8 which is equal to the inverse of the bit rate. Thus the output signal 16 may be generated from the received bit stream in "real time", wherein after receiving an individual bit of the bit stream, a corresponding portion of the output signal 16 is generated after a minimal time delay. Furthermore, it may be expected that for a given bit rate of the output signal 16, the bandwidth of the output signal 16 is minimized by setting the time gap 8 equal to the inverse of the bit rate. Of course, the time gap T between the first point in time 2 and the second point in time 6 may alternatively be chosen shorter or longer than the period of the bit rate, as pointed out above. It is further noted that the first signal value $F_0$ and the second signal value $F_1$ enter into the computation as parameters. This is particularly convenient if these values are to be changed for some reason or other.

The table in FIG. 7 summarizes exemplary numerical data related to the computation of the frequency ratio $F/F_{ref}$ for generating the signal 16 illustrated in FIG. 6. In the example, $F_1$=434.1 MHz, $F_0$=434 MHz, and $F_{ref}$=26 MHz. The frequency ratio $F/F_{ref}$ thus varies between $$F_0/F_{ref}=434.0 \text{ MHz}/26 \text{ MHz}=16.692$$

and $$F_1/F_{ref}=434.1 \text{ MHz}/26 \text{ MHz}=16.696.$$

From the table it is apparent that only basic digital operations are required to compute the frequency ratio.

Figure 8:
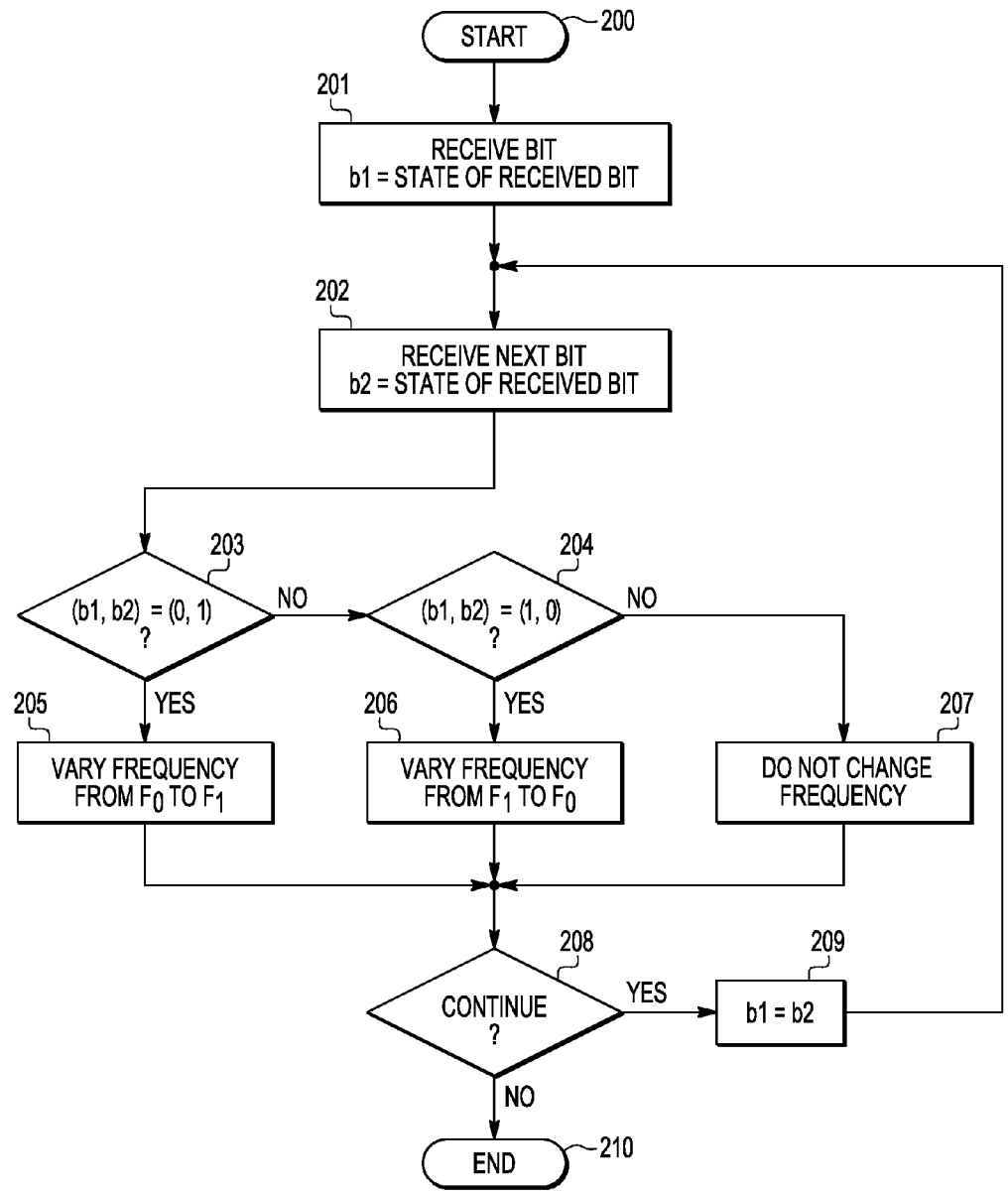
FIG. 8 shows a flow chart which illustrates, in a simplified manner, an example of a method of generating an output signal representing a binary sequence.

Referring now to FIG. 8, there is illustrated a method of generating an output signal representing a binary sequence, the output signal being the time-dependence of a signal value F. The method starts in step 200 in which a first signal value $F_0$ and a different second signal value $F_1$ are received or retrieved from a memory. In subsequent steps 201 and 202, a first data bit and a second data bit are received. Step 202 being part of a loop, a sequence of data bits 12 can be received, each data bit having a state which is either "zero" or "one", and the sequence containing at least a first data bit and a subsequent second data bit. The state of the first data bit and the state of the second data bit are then determined (not shown). In a subsequent step 203, it is determined whether the state of the first data bit and the state of the second data bit are "zero" and "one", respectively. If so, the signal value F is controlled to change monotonically from the first signal value $F_0$ at a first point in time via one or more intermediate values at intermediate points in time to a second signal value $F_1$ at a later second point in time (step 205). Otherwise it is determined (in step 204) whether the state of the first data bit and the state of the second data bit are "one" and "zero", respectively. If so, the signal value F is controlled to change monotonically from the second signal value $F_1$ at the first point in time via one or more intermediate values at intermediate points in time to the first signal value $F_0$ at the second point in time (step 206). Otherwise the signal value is not changed (step 207). Upon performing one of the steps 205, 206, and 207, it is determined whether the process is to be continued, i.e., whether further data bits of the sequence of data bits 12 are to be represented in the generated output signal F(t). If so, the second data bit is relabeled to become the first data bit (step 209) and the process returns to step 202 described above; otherwise, the process ends (step 210).

In the context of the method described above with reference to FIG. 8, it is noted that an information carrier may carry code portions for executing steps of the method when run on a programmable device.

The invention may also be implemented in a computer program for running on a computer system, at least including code portions for performing steps of a method according to the invention when run on a programmable apparatus, such as a computer system or enabling a programmable apparatus to perform functions of a device or system according to the invention. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system. The computer program may be provided on a data carrier, such as a CD-rom or diskette, stored with data loadable in a memory of a computer system, the data representing the computer program. The data carrier may further be a data connection, such as a telephone cable or a wireless connection.

Some of the above embodiments, as applicable, may be implemented using a variety of different information processing systems. For example, although FIG. 5 and the discussion thereof describe an exemplary information processing architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention. Those skilled in the art will recognize that the boundaries between logic blocks are merely illustrative and that alternative embodiments may merge logic blocks or circuit elements or impose an alternate decomposition of functionality upon various logic blocks or circuit elements.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of the signal shaper 10 are circuitry located on a single integrated circuit or within a same device. Alternatively, system 10 may include any number of separate integrated circuits or separate devices interconnected with each other. For example, the PLL 26 may be located on a same integrated circuit as the controller 40 or on a separate integrated circuit or located within another peripheral or slave discretely separate from other elements of system 10. Also for example, the signal shaper 10 or portions thereof may be soft or code representations of physical circuitry or of logical representations convertible into physical circuitry. As such, the signal shaper 10 may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

All or some of the software described herein may be received from elements of the signal shaper 10, for example, from computer readable media such as a memory of the data shaper 42 or other media on other computer systems. Such computer readable media may be permanently, removably or remotely coupled to an information processing system such as the signal shaper 10. The computer readable media may include, for example and without limitation, any number of the following: magnetic storage media including disk and tape storage media; optical storage media such as compact disk media (e.g., CD-ROM, CD-R, etc.) and digital video disk storage media; nonvolatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

In one embodiment, the signal shaper 10 is a computer system such as a personal computer system. Other embodiments may include different types of computer systems. Computer systems are information handling systems which can be designed to give independent computing power to one or more users. Computer systems may be found in many forms including but not limited to mainframes, minicomputers, servers, workstations, personal computers, notepads, personal digital assistants, electronic games, automotive and other embedded systems, cell phones and various other wireless devices. A typical computer system includes at least one processing unit, associated memory and a number of input/output (I/O) devices.

A computer system processes information according to a program and produces resultant output information via I/O devices. A program is a list of instructions such as a particular application program and/or an operating system. A computer program is typically stored internally on computer readable storage medium or transmitted to the computer system via a computer readable transmission medium. A computer process typically includes an executing (running) program or portion of a program, current program values and state information, and the resources used by the operating system to manage the execution of the process. A parent process may spawn other, child processes to help perform the overall functionality of the parent process. Because the parent process specifically spawns the child processes to perform a portion of the overall functionality of the parent process, the functions performed by child processes (and grandchild processes, etc.) may sometimes be described as being performed by the parent process.

Also, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. Also, devices functionally forming separate devices may be integrated in a single physical device.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word "comprising" does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. A signal shaper for generating an output signal representing a binary sequence, the output signal being a time-dependence of a signal value F, comprising:
the signal shaper is configured to
receive a first signal value $F_0$ and a different second signal value $F_1$;
receive a sequence of data bits, each data bit having a state which is either "zero" or "one", the sequence containing at least a first data bit and a subsequent second data bit;
determine the state of the first data bit and the state of the second data bit;
if the state of the first data bit and the state of the second data bit are determined to be "zero" and "one", respectively, controlling the signal value F to change monotonically from the first signal value $F_0$ at a first point in time via one or more intermediate values at intermediate points in time to a second signal value $F_1$ at a later second point in time; and,
if the state of the first data bit and the state of the second data bit are determined to be "one" and "zero", respectively, controlling the signal value F to change monotonically from the second signal value $F_1$ at the first point in time via one or more intermediate values at intermediate points in time to the first signal value $F_0$ at the second point in time, wherein the signal value F is an oscillation frequency delivered by a phase-locked loop; wherein the signal shaper is in an integrated circuit.

2. The signal shaper as claimed in claim 1, wherein the signal value F is a frequency or amplitude of a voltage or current.

3. The signal shaper as claimed in claim 1, wherein on a time interval from the first point in time to the second point in time the output signal is a monotonic step function.

4. The signal shaper as claimed in claim 1, wherein the signal shaper comprises a clock for determining the intermediate points in time and the second point in time relative to the first point in time.

5. The signal shaper as claimed in claim 1, wherein the signal shaper is configured to
receive the sequence of data bits in the form of a bit stream; and
recognize a bit rate of the bit stream;
and wherein the first point in time and the second point in time are separated by a time gap which is equal to the inverse of the bit rate.

6. The signal shaper as claimed in claim 1, comprising a controller for controlling the oscillation frequency delivered by the phase-locked loop as a function of the received sequence of data bits.

7. The signal shaper as claimed in claim 6, wherein the phase-locked loop comprises a frequency divider having a frequency ratio, the frequency ratio determining the oscillation frequency delivered by the phase-locked loop, and wherein the controller is capable of controlling the frequency ratio.

8. The signal shaper as claimed in claim 7, wherein the controller is capable of generating a frequency ratio signal indicating an integer number to the frequency divider, the integer number defining the frequency ratio, wherein the controller is capable of varying the frequency ratio signal at a rate at least 50 times greater than the inverse of the time gap between the first point in time and the second point in time.

9. The signal shaper as claimed in claim 8, wherein the controller comprises a sigma-delta modulator for generating the frequency ratio signal.

10. The signal shaper as claimed in claim 1, wherein the signal shaper is the integrated circuit.

11. A communication system comprising a signal shaper as claimed in claim 1.

12. The signal shaper as claimed in claim 1, wherein the intermediate points in time comprise 2N+1 equidistant points in time at which the signal value F assumes the following values:

$F_0 + \Delta F / 2^{k+1}$ where $k = 0, \ldots, N$; and $F_1 - \Delta F / 2^{k+1}$ where $k = 1, \ldots, N$;

N being an integer number equal to or greater than zero, and $\Delta F$ being the difference $F_1 - F_0$.

13. A signal shaper for generating an output signal representing a binary sequence, the output signal being a time-dependence of a signal value F, comprising:
the signal shaper is configured to
receive a first signal value $F_0$ and a different second signal value $F_1$;
receive a sequence of data bits, each data bit having a state which is either "zero" or "one", the sequence containing at least a first data bit and a subsequent second data bit;
determine the state of the first data bit and the state of the second data bit;
if the state of the first data bit and the state of the second data bit are determined to be "zero" and "one", respectively, controlling the signal value F to change monotonically from the first signal value $F_0$ at a first point in time via one or more intermediate values at intermediate points in time to a second signal value $F_1$ at a later second point in time, wherein the intermediate points in time comprise 2N+1 equidistant points in time at which the signal value F assumes the following values:

$F_0 + \Delta F / 2^{k+1}$ where $k = 0, \ldots, N$; and $F_1 - \Delta F / 2^{k+1}$ where $k = 1, \ldots, N$;

N being an integer number equal to or greater than zero, and $\Delta F$ being the difference $F_1 - F_0$; and,
if the state of the first data bit and the state of the second data bit are determined to be "one" and "zero", respectively, controlling the signal value F to change monotonically from the second signal value $F_1$ at the first point in time via one or more intermediate values at intermediate points in time to the first signal value $F_0$ at the second point in time; wherein the signal shaper is in an integrated circuit.

14. A method of generating an output signal representing a binary sequence, the output signal being a time-dependence of a signal value F, the method comprising:
receiving a first signal value $F_0$ and a different second signal value $F_1$;
receiving a sequence of data bits, each data bit having a state which is either "zero" or "one", the sequence containing at least a first data bit and a subsequent second data bit;
determining the state of the first data bit and the state of the second data bit;
if it is determined that the state of the first data bit and the state of the second data bit are "zero" and "one", respectively, controlling the signal value F to change monotonically from the first signal value $F_0$ at a first point in time via one or more intermediate values at intermediate points in time to a second signal value $F_1$ at a later second point in time;
if it is determined that the state of the first data bit and the state of the second data bit are "one" and "zero", respectively, controlling the signal value F to change monotonically from the second signal value $F_1$ at the first point in time via one or more intermediate values at intermediate points in time to the first signal value $F_0$ at the second point in time; and
controlling an oscillation frequency delivered by a phase-locked loop as a function of the received sequence of data bits.

15. An information carrier embodied in a non-transitory tangible medium carrying code portions for executing steps of a method as claimed in claim 14 when run on a programmable device.

16. The method of claim 14, wherein the signal value F is the oscillation frequency delivered by the phase-locked loop.

17. The method of claim 16, wherein the controlling the oscillation frequency delivered by the phase-locked loop comprises:
performing frequency division according to a frequency ratio, the frequency ratio determining the oscillation frequency delivered by the phase-locked loop.

18. The method of claim 17, wherein the performing the frequency division comprises:
generating a frequency ratio signal indicating an integer number, the integer number defining the frequency ratio, and;

varying the frequency ratio signal at a rate at least 50 times greater than an inverse of a time gap between the first point in time and the second point in time.

19. The method of claim 18, wherein the generating the frequency ratio signal comprises:
generating the frequency ratio signal using a sigma-delta modulator.

20. The method of claim 14, further comprising:
receiving the sequence of data bits in the form of a bit stream; and
recognizing a bit rate of the bit stream, wherein the first point in time and the second point in time are separated by a time gap which is equal to an inverse of the bit rate.

* * * * *